(12) United States Patent
Kasai et al.

(10) Patent No.: US 11,988,534 B2
(45) Date of Patent: May 21, 2024

(54) THERMOPILE SENSOR

(71) Applicant: MMI SEMICONDUCTOR CO., LTD., Tokyo (JP)

(72) Inventors: Takashi Kasai, Kyoto (JP); Koji Momotani, Kyoto (JP)

(73) Assignee: MMI SEMICONDUCTOR CO., LTD., Tokyo (JP)

( * ) Notice: Subject to any disclaimer, the term of this patent is extended or adjusted under 35 U.S.C. 154(b) by 143 days.

(21) Appl. No.: 17/905,273

(22) PCT Filed: Dec. 15, 2020

(86) PCT No.: PCT/JP2020/046684
§ 371 (c)(1),
(2) Date: Aug. 30, 2022

(87) PCT Pub. No.: WO2021/176793
PCT Pub. Date: Sep. 10, 2021

(65) Prior Publication Data
US 2023/0101259 A1    Mar. 30, 2023

(30) Foreign Application Priority Data

Mar. 2, 2020  (JP) .................................. 2020-035134

(51) Int. Cl.
*G01F 1/688*  (2006.01)
*G01F 1/684*  (2006.01)
(Continued)

(52) U.S. Cl.
CPC .......... *G01F 1/6888* (2013.01); *G01F 1/6845* (2013.01); *G01F 1/696* (2013.01); *H10N 10/851* (2023.02)

(58) Field of Classification Search
CPC ...... G01F 1/6888; G01F 1/6845; G01F 1/696; G01F 1/692; G01F 15/046; H10N 10/851; G01J 5/12; G01K 7/02; G01P 5/10
See application file for complete search history.

(56) References Cited

U.S. PATENT DOCUMENTS

| 7,282,712 B2 | 10/2007 | Shibayama | |
| 2003/0205670 A1* | 11/2003 | Shibayama | G01J 5/12 250/338.4 |
| 2007/0241093 A1 | 10/2007 | von Waldkirch et al. | |

FOREIGN PATENT DOCUMENTS

| JP | 2007-279036 | 10/2007 |
| JP | 4009046 | 11/2007 |

OTHER PUBLICATIONS

Zhou, Huchuan et al., "Development of a thermopile infrared sensor using stacked double polycrystalline silicon layers based on the CMOS process." Journal of Micromechanics and Microengineering 23.6 (2013): 065026.

(Continued)

*Primary Examiner* — Herbert K Roberts
*Assistant Examiner* — Anthony W Megna Fuentes
(74) *Attorney, Agent, or Firm* — IPUSA, PLLC

(57) ABSTRACT

A thermopile sensor includes a thermopile. The thermopile is formed by connecting thermocouples, in series on an insulating film, in which a first PolySi interconnect and a metal interconnect including a metal portion in at least a part thereof are connected, each of the thermocouples connected in series is arranged side by side with a predetermined gap, the metal interconnect is arranged to overlap the first PolySi interconnect in each of the thermocouples, at a connection portion between a thermocouple and an adjacent thermocouple, the metal interconnect crosses the gap between the first PolySi interconnects, and a first width of a portion of the gap where the metal interconnect crosses the gap between (Continued)

the first PolySi interconnects is greater than a second width of a remaining portion of the gap between the first PolySi interconnects.

10 Claims, 14 Drawing Sheets

(51) Int. Cl.
    *G01F 1/696*     (2006.01)
    *H10N 10/851*     (2023.01)
    *G01F 1/692*     (2006.01)
    *G01F 15/04*     (2006.01)
    *G01J 5/12*     (2006.01)
    *G01K 7/02*     (2021.01)
    *G01P 5/10*     (2006.01)

(56) References Cited

OTHER PUBLICATIONS

International Search Report of Int. Appl. No. PCT/JP2020/046684 dated Jan. 19, 2021.

\* cited by examiner

THERMOPILE SENSOR

TECHNICAL FIELD

The disclosure herein relates to a thermopile sensor.

BACKGROUND ART

Conventionally, flow rate measurement devices including a heater disposed in a flow path through which a fluid flows to heat the fluid, a first temperature sensor (thermopile) disposed on an upstream side of the flow path with respect to the heater, and a second temperature sensor (thermopile) disposed on a downstream side of the flow path with respect to the heater have been proposed.

In the flow rate measurement devices described above, a thermopile includes multiple thermocouples formed in series on a substrate, and each pair of the thermocouples is formed from two types of conductors or semiconductors. Further, one material in the thermocouple is exemplified by polysilicon (hereinafter, PolySi), while the other material is exemplified by a metal such as aluminum (for example, see Patent Document 1).

Further, a new thermopile IR sensor has also been proposed that has a structure in which a hot junction located on the same side as a heater and a cold junction located on the opposite side are connected to each other in a thermocouple constituting a thermopile, an electromotive force is generated in accordance with a temperature difference between the hot junction and the cold junction, and aluminum wiring is superimposed on p-type or n-type polysilicon (PolySi) has been proposed (for example, see Non-Patent Document 1).

RELATED-ART DOCUMENTS

Patent Documents

Patent Document 1: Japanese Patent No. 5112728

Non-Patent Documents

Non-Patent Document 1: Zhou, Huchuan, et al. "Development of a thermopile infrared sensor using stacked double polycrystalline silicon layers based on the CMOS process." Journal of Micromechanics and Microengineering 23.6 (2013): 065026.

SUMMARY OF THE INVENTION

Problem to be Solved by the Invention

In the thermopile sensors as described above, it is required to increase the sensitivity of the thermopile sensors at the time of temperature measurement by configuring each thermopile and arranging thermocouples composed of PolySi and metal more closely.

Further, in such cases, a thin metal film in each thermocouple is often connected to a contact point of the PolySi film in the adjacent thermocouples across a gap between the adjacent thermocouples.

In order to improve the sensitivity of the thermopile sensors as described above, the gap between each pair of the thermocouples is narrowed. However, it is difficult to form a thin metal film on the stepped portion of the gap, and the film tends to be thin and the quality of the film is poor. There is a risk that a resistance value increases or a breakage occurs in a thin metal film in which the thin metal film of each thermocouple crosses the gap with the adjacent thermocouple.

Therefore, an object of the present disclosure is to provide a thermopile sensor having sufficient reliability which can prevent an increase in the resistance value of a thin metal film, breakage, and the like even when a gap between the thermocouples is narrowed in order to increase sensitivity.

Means For Solving the Problem

According to an aspect of the present disclosure, a thermopile sensor includes a thermopile, wherein the thermopile is formed by connecting thermocouples, in series on an insulating film, in which a PolySi interconnect and a metal interconnect including a metal portion in at least a part thereof are connected, each of the thermocouples connected in series is arranged side by side with a predetermined gap, the metal interconnect is arranged to overlap the PolySi interconnect in each of the thermocouples, at a connection portion between a thermocouple and an adjacent thermocouple, the metal interconnect crosses the gap between the PolySi interconnects, and a width of a portion of the gap where the metal interconnect crosses the gap between the PolySi interconnects is greater than a width of a remaining portion of the gap between the PolySi interconnects.

Further, according to the present disclosure, the thermopile sensor may be configured such that the insulating film is formed on a silicon substrate, the silicon substrate includes a cavity area that is a recessed portion opened to the insulating film side and a frame disposed so as to surround the cavity area, and a portion where the metal interconnect crosses the gap between the PolySi interconnects is disposed on the frame. According to this configuration, when a voltage is applied to the heater to generate heat, the heat of the heater is maintained in the cavity area, and it is possible to suppress the escape of the heat of the heater into the silicon substrate. Further, since the portion where the metal interconnect crosses the gap between the PolySi interconnects can be disposed on a stable frame which is less likely to be affected by thermal expansion, external stress, or the like, it is possible to suppress deterioration of the metal interconnect more reliably in the portion and to further improve reliability.

Further, according to the present disclosure, the thermopile sensor may be configured such that the width of the portion of the gap where the metal interconnect crosses the gap between the PolySi interconnects is 1.5 times or more and 5 times or less than the width of the remaining portion of the gap between the PolySi interconnects. According to this configuration, the width of the portion of the gap where the metal interconnect crosses the gap between the PolySi interconnects can be made sufficiently wider than the width of the remaining portion, and the metal film in the portion where the metal interconnect crosses the gap between the PolySi interconnects can be sufficiently formed. As a result, it is possible to more reliably suppress disconnection and increase in resistance of the metal interconnect in the portion, and it is possible to further improve reliability.

Further, according to the present disclosure, the thermopile sensor may be configured such that the width of the portion of the gap where the metal interconnect crosses the gap between the PolySi interconnects is equal to or greater than a film thickness of the PolySi interconnect. According to this configuration, since the gap between the PolySi interconnects is wide in the portion of the gap where the metal interconnect crosses the gap between the PolySi interconnects, metal atoms can be spread even in the gap having a stepped portion in the semiconductor process, and a covering (coating) property of the stepped portion is improved. As a result, it is possible to sufficiently thicken the metal film in the portion where the metal interconnect crosses the gap between the PolySi interconnects, and it is possible to more reliably suppress disconnection and increase in resistance of the metal interconnect in the portion.

Further, according to the present disclosure, the thermopile sensor may be configured such that the width of the portion of the gap where the metal interconnect crosses the gap between the PolySi interconnects is 1 µm or more and 10 µm or less. According to this configuration, the width of the portion of the gap where the metal interconnect crosses the gap between the PolySi interconnects can be made sufficiently wide, and the metal film in the portion where the metal interconnect crosses the gap between the PolySi interconnects can be sufficiently formed.

Further, according to the present disclosure, the thermopile sensor may be configured such that the width of the remaining portion of the gap between the PolySi interconnects is 0.1 µm or more and 5 µm or less. According to this configuration, the thermocouples can be arranged at a sufficiently high density, and the sensitivity of the sensor can be more reliably increased. Further, the width of the portion of the gap where the metal interconnect crosses the gap between the PolySi interconnects can be made sufficiently wider than the width of the remaining portion of the gap.

Further, according to the present disclosure, the thermopile sensor may be configured such that the PolySi interconnect extends from the frame toward a vicinity of a center of the cavity area, the PolySi interconnect is short-circuited with the metal interconnect in the vicinity of the center of the cavity area to form a hot junction, the metal interconnect extends, on the PolySi interconnect, from the vicinity of the center of the cavity area toward the frame, and the metal interconnect crosses the gap between the PolySi interconnects and is electrically short-circuited with an end portion of an adjacent PolySi to form a cold junction. According to this configuration, since the hot junction is located on the cavity area where the temperature easily rises and the cold junction is located on the frame where the temperature does not easily rise, a temperature difference is easily generated and a greater electromotive force is easily obtained.

Further, according to the present disclosure, the thermopile sensor may be configured such that a part of the metal interconnect is formed by a second PolySi interconnect containing an impurity different from the impurity of the PolySi interconnect. According to this configuration, since two layers of the PolySi interconnects contain different impurities, a difference in physical properties occurs, and a greater electromotive force is easily obtained.

Further, according to the present disclosure, the thermopile sensor may be configured such that a center portion of the metal interconnect is formed by the second PolySi interconnect containing the impurity different from the impurity of the PolySi interconnect, and both end portions are formed by a metal film. In this case, one of the different impurities may be a p-type impurity, and the other may be an n-type impurity. Also in this case, since the two layers of the PolySi interconnects contain different impurities, a difference in physical properties occurs, and a greater electromotive force is easily obtained.

In the present disclosure, the means for solving the above problems can be used in combination as much as possible.

Effects of the Invention

With regard to the thermopile sensor, when detecting the flow rate of gas, it is possible to provide a new technique that satisfactorily provides both high sensitivity related to the heat of the heater for measuring a temperature difference and reliability for suppressing breakage of a metal film.

MODE OF CARRYING OUT THE INVENTION

Application Examples

In the present application example, a case in which a thermopile is applied to a thermal flow rate measurement device will be described. The thermopile sensor according to the present application examples includes a thermopile, and the thermopile includes multiple thermocouples. Each pair of thermocouples connects a hot junction located on the same side as a heater and a cold junction located on the opposite side of the heater and paired with the hot junction.

Figure 6:
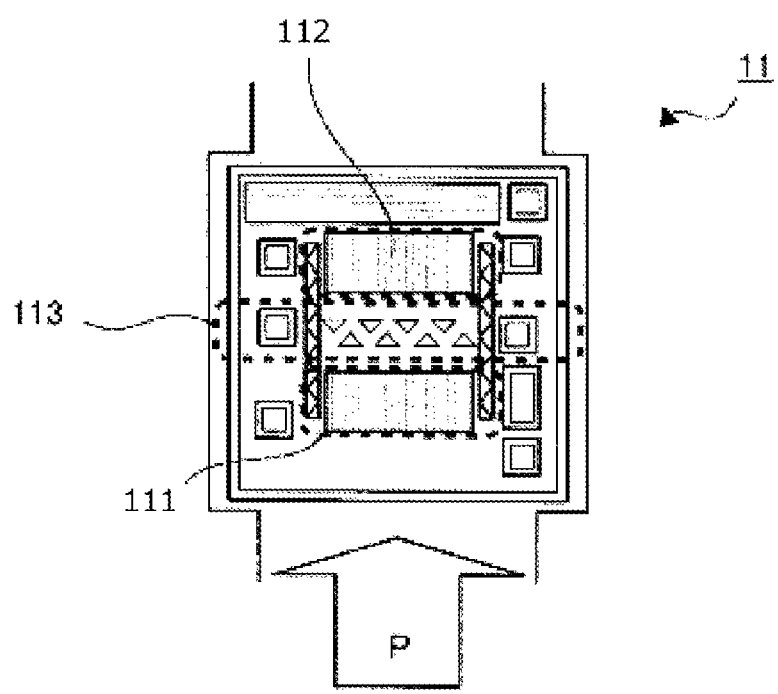
FIG. 6 is a plan view illustrating a schematic configuration of a flow rate detector.
Figure 12:
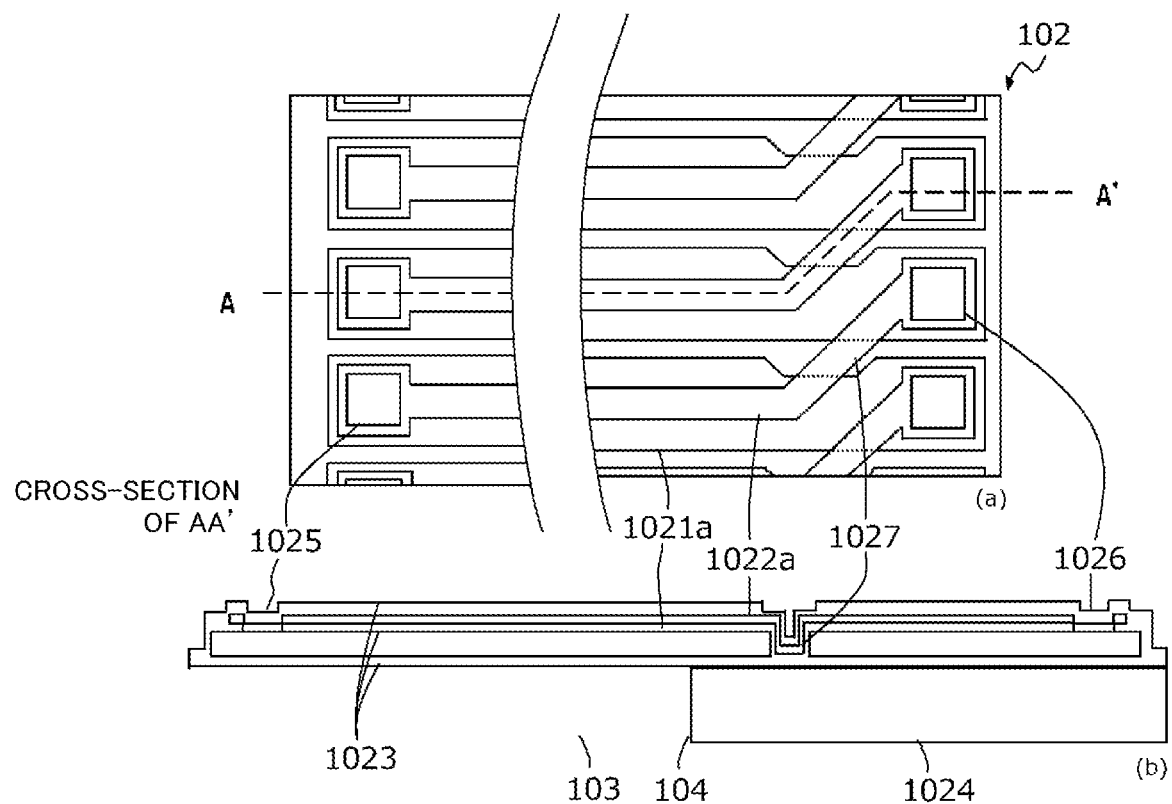
FIG. 12 is a schematic diagram illustrating the details of the configuration of a thermopile.

Further, the thermocouple includes a PolySi interconnect and a metal film which is provided on the PolySi interconnect and has a width smaller than that of the PolySi interconnect. Since the metal film has good thermal conductivity and dissipates heat, the wiring width of the metal film is generally reduced. An insulating film made of silicon oxide, silicon nitride, or the like is formed above and below the thermopile and the heater. FIG. 6 illustrates an example of a positional relationship between the heater and the thermopile, and FIG. 12 illustrates a configuration of the thermopile.

Figure 11:
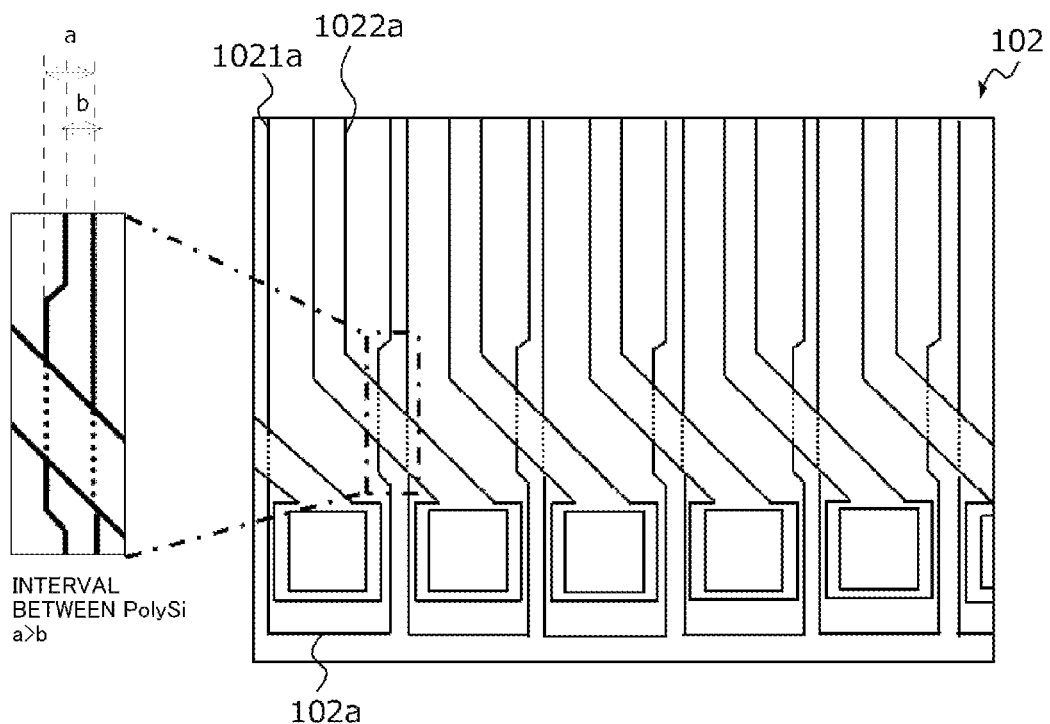
FIG. 11 is a schematic view illustrating a condition of a configuration of a thermopile in a case where a gap width of a portion where the metal film crosses is made greater than a gap width of the remaining portion.

As illustrated in FIG. 11, the hot junction is formed by electrically short-circuiting the PolySi interconnect and the metal film. Further, the metal film crosses the gap between the thermocouple and the adjacent thermocouple and serves to connect them. The cold junction is formed by electrically short-circuiting the PolySi interconnect and the metal film at the tip of the portion where the metal film crosses the gap between the thermocouples.

As illustrated in FIG. 6 as an example, the thermopiles are provided symmetrically with respect to the heater, and a side from which gas flows along a flow path at the time of flow rate detection is defined as the upstream side, and the opposite side is defined as the downstream side. Further, as illustrated in FIG. 12, the insulating film is formed on the silicon substrate, and a part of the insulating film is located on a cavity area surrounded by a frame made of PolySi.

Figure 5:
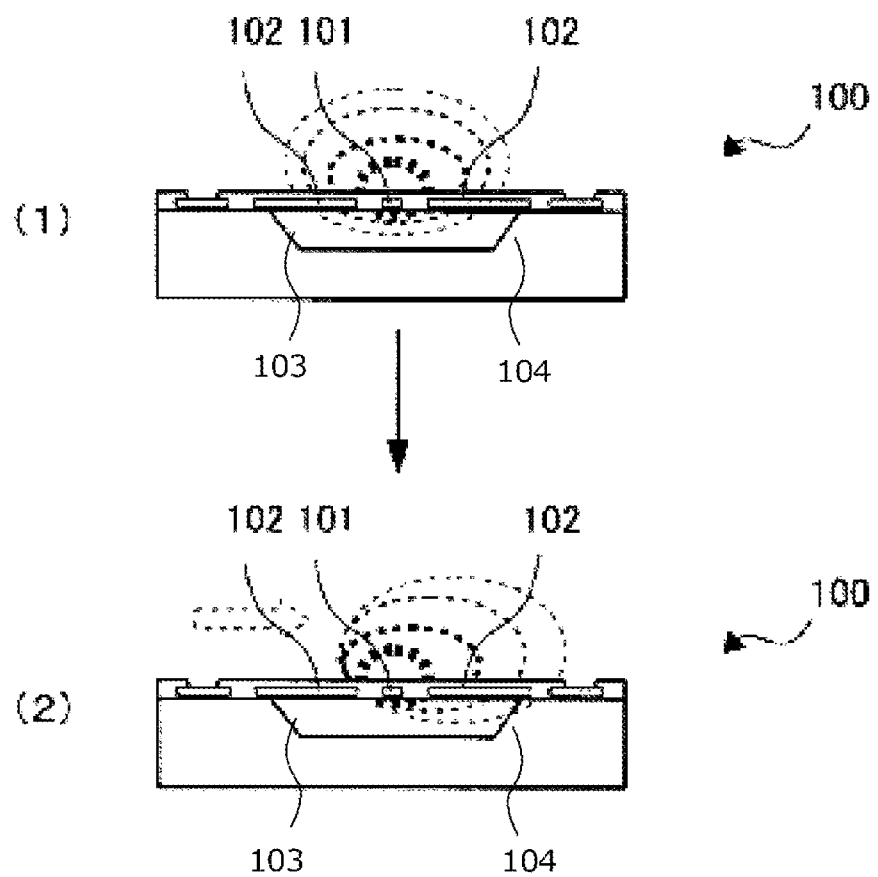
FIG. 5 is a cross-sectional view for explaining a mechanism of the sensor element.

As illustrated in FIG. 5, when a voltage is applied to the heater in the thermopile sensor which is the object of the present disclosure, heat is generated, and the heat of the heater is uniformly distributed on the thermopiles on both sides of the heater. Here, since the cavity area is provided and the heater is located in the center of the upper portion of the cavity area, the heat of the heater can be prevented from being diffused into the silicon substrate. When the gas flows along the flow path, the heat distribution of the heater is biased to the thermopile on the downstream side, and a temperature difference occurs between the thermopiles on both sides.

In the thermocouple, when the heat of the heater is sensed at the hot junction, an electromotive force is generated due to a temperature difference with the cold junction (Seebeck effect). By the electromotive force, the temperature difference between the thermopiles can be detected, and the value of the flow rate of the flowing gas can be observed. Here, as the value of the flow rate of the flowing gas increases, the value of the temperature difference between the thermopiles also increases, and since the two values have a correlation, it can be said that a connection is possible.

When the temperature difference between thermopiles is detected, the thermopiles are required to be highly sensitive to the heat of the heater. In the thermopile, it is considered that the more closely the thermocouples are arranged in parallel, the higher the sensitivity is, and it can be said that a condition in which a gap width between the thermocouples is small is preferable.

However, under a condition in which the gap width between the thermocouples is small, there is a risk that a resistance value increases or a breakage occurs in the metal film when the metal film crosses the gap. This is because, as described above, at the step in the gap between the thermocouples, the metal film is difficult to form and the film thickness tends to be thin or the film quality tends to be poor. Therefore, the thermopile is required to have high sensitivity and reliability in which an increase in the resistance value and the occurrence of disconnection are prevented.

Therefore, in the present disclosure, as illustrated in FIG. 11, a thermopile is proposed which is composed of thermocouples closely arranged in parallel and in which a gap width of a portion where a metal film crosses the thermocouple and the adjacent thermocouple is wider than a gap width of the remaining portion. The value of "a" illustrated in FIG. 11 is assumed to be greater than the value of "b", the value of "a" is preferably within a range of 1 µm or more and 10 µm or less, and the value of "b" is preferably within a range of 0.1 µm or more and 5 µm or less.

<Embodiment 1>

Hereinafter, a flow rate measurement device according to an embodiment of the present disclosure will be described with reference to the drawings. In the following embodiment, an example in which the present disclosure is applied to a flow rate measurement device will be described, but the present disclosure may be applied to other thermopile sensors such as an infrared sensor. The embodiment described below is an example of a flow rate measurement device, and the flow rate measurement device according to the present disclosure is not limited to the following configuration.

<Device Configuration>

Figure 1:
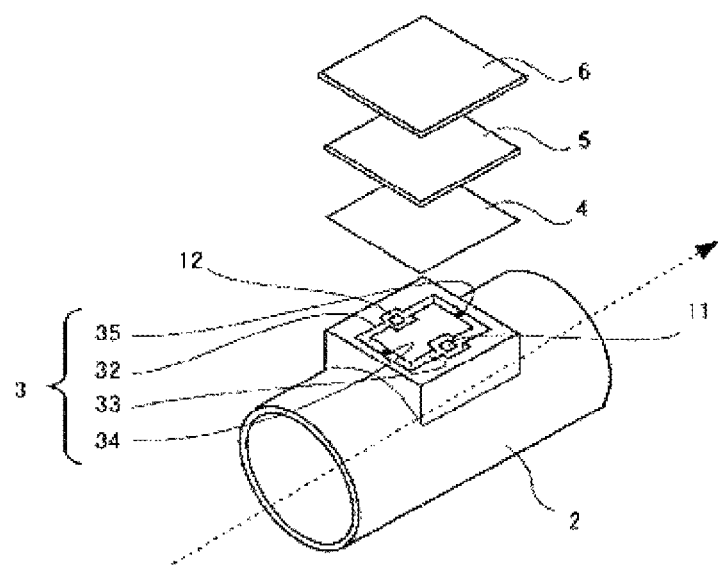
FIG. 1 is an exploded perspective view illustrating an example of a flow rate measurement device according to an embodiment.
Figure 2:
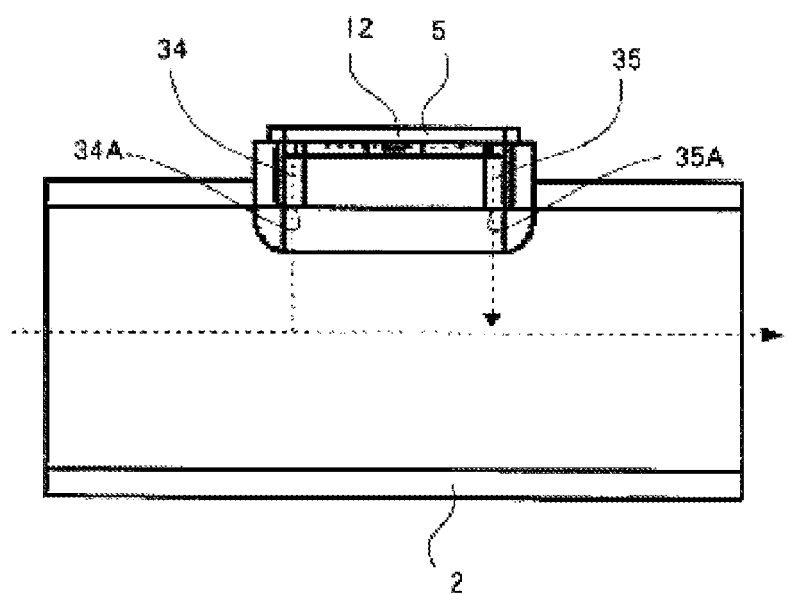
FIG. 2 is a perspective view illustrating an example of a flow rate measurement device.

FIG. 1 is an exploded perspective view illustrating an example of a flow rate measurement device 1 according to the present embodiment. FIG. 2 is a perspective view illustrating an example of the flow rate measurement device 1.

The flow rate measurement device 1 is incorporated in, for example, a gas meter, a combustion device, an internal combustion engine such as an automobile, a fuel cell, other industrial equipment such as medical equipment, and an incorporated device, and measures the amount of gas passing through a flow path. The dashed arrows in FIG. 1 and FIG. 2 illustrate a direction in which a fluid flows. Here, the flow rate measurement device 1 corresponds to a thermopile sensor in the present disclosure.

As illustrated in FIG. 2, in the present embodiment, the flow rate measurement device 1 is provided inside a sub flow path portion 3 branched from a main flow path portion 2. Further, the flow rate measurement device 1 includes a flow rate detector 11 and a physical property detector 12. The flow rate detector 11 and the physical property detector 12 are thermal flow sensors including a heater formed by a micro-heater and a temperature detector formed by a thermopile.

As illustrated in FIG. 1 and FIG. 2, the flow rate measurement device 1 according to the present embodiment includes the main flow path portion 2, the sub flow path portion 3, a seal 4, a circuit board 5, and a cover 6.

The main flow path portion 2 is a tubular member penetrating in the longitudinal direction. On the inner peripheral surface of the main flow path portion 2, an inflow port (first inflow port) 34A is formed on the upstream side with respect to the flow direction of the fluid to be measured, and an outflow port (first outflow port) 35A is formed on the downstream side. For example, the length of the main flow path portion 2 in the axial direction is substantially 50 mm, the diameter of the inner peripheral surface (the inner diameter of the main flow path portion 2) is substantially 20 mm, and the outer diameter of the main flow path portion 2 is substantially 24 mm, but the present disclosure is not limited to these examples.

The sub flow path portion 3 is provided on the main flow path portion 2, and a sub flow path is formed on the inside and the upper surface of the sub flow path portion 3. One end of the sub flow path portion 3 communicates with the inflow port 34A, and the other end communicates with the outflow port 35A. In the flow rate measurement device 1, the sub flow path portion 3 includes an inflow flow path 34, a physical property detection flow path 32, a flow rate detection flow path 33, and an outflow flow path 35.

The inflow flow path 34 is a flow path for allowing the fluid to be measured flowing through the main flow path portion 2 to flow into the physical property detection flow path 32 and the flow rate detection flow path 33. The inflow flow path 34 is formed so as to penetrate the sub flow path portion 3 in a direction perpendicular to the main flow path portion 2, and has one end communicating with the inflow port 34A and the other end opening on the upper surface of the main flow path portion 2 and communicating with the physical property detection flow path 32 and the flow rate detection flow path 33. Accordingly, a part of the fluid to be measured flowing through the main flow path portion 2 can be divided into the physical property detection flow path 32 and the flow rate detection flow path 33 through the inflow flow path 34.

The physical property detection flow path 32 is formed on the upper surface of the sub flow path portion 3, extends in a direction parallel to the main flow path portion 2, and has a substantially U-shaped vertical cross section. In the physical property detection flow path 32, a physical property detector 12 for detecting a physical property of the fluid to be measured is disposed at a position extending in the longitudinal direction (direction parallel to the main flow path portion 2).

One end of the physical property detection flow path 32 communicates with the inflow port 34A via the inflow flow path 34, and the other end communicates with the outflow port 35A via the outflow flow path 35.

The flow rate detection flow path 33 is formed on the upper surface of the sub flow path portion 3, extends in a direction parallel to the main flow path portion 2, and has a substantially U-shaped vertical cross section. The flow rate detection flow path 33 has a flow rate detection flow path 33 in which the flow rate detector 11 for detecting a flow rate of the fluid to be measured is disposed at a portion extending in the longitudinal direction (direction parallel to the main flow path portion 2).

One end of the flow rate detection flow path 33 communicates with the inflow port 34A via the inflow flow path 34, and the other end communicates with the outflow port 35A via the outflow flow path 35. Note that the physical property detector 12 and the flow rate detector 11 are disposed in the physical property detection flow path 32 or the flow rate detection flow path 33 in a state of being mounted on the circuit board 5.

The outflow flow path 35 is a flow path for allowing the fluid to be measured that has passed through the physical property detection flow path 32 and the flow rate detection flow path 33 to flow out to the main flow path portion 2. The outflow flow path 35 is formed so as to penetrate the sub flow path portion 3 in a direction perpendicular to the main flow path portion 2, and has one end communicating with the outflow port 35A and the other end opening on the upper surface of the main flow path portion 2 and communicating with the physical property detection flow path 32 and the flow rate detection flow path 33. Accordingly, the fluid to be measured that has passed through the physical property detection flow path 32 and the flow rate detection flow path 33 can be caused to flow out to the main flow path portion 2 through the outflow flow path 35.

In this way, the fluid to be measured flowing in from the same inflow port 34A is divided into the physical property detection flow path 32 and the flow rate detection flow path 33, so that the physical property detector 12 and the flow rate detector 11 can detect the physical property or the flow rate based on the fluid to be measured having the same conditions such as temperature and density. Therefore, the measurement accuracy of the flow rate measurement device 1 can be improved.

In the flow rate measurement device 1, the circuit board 5 is disposed after the seal 4 is fitted into the sub flow path portion 3, and the airtightness inside the sub flow path portion 3 is secured by fixing the circuit board 5 to the sub flow path portion 3 with the cover 6.

Figure 3:
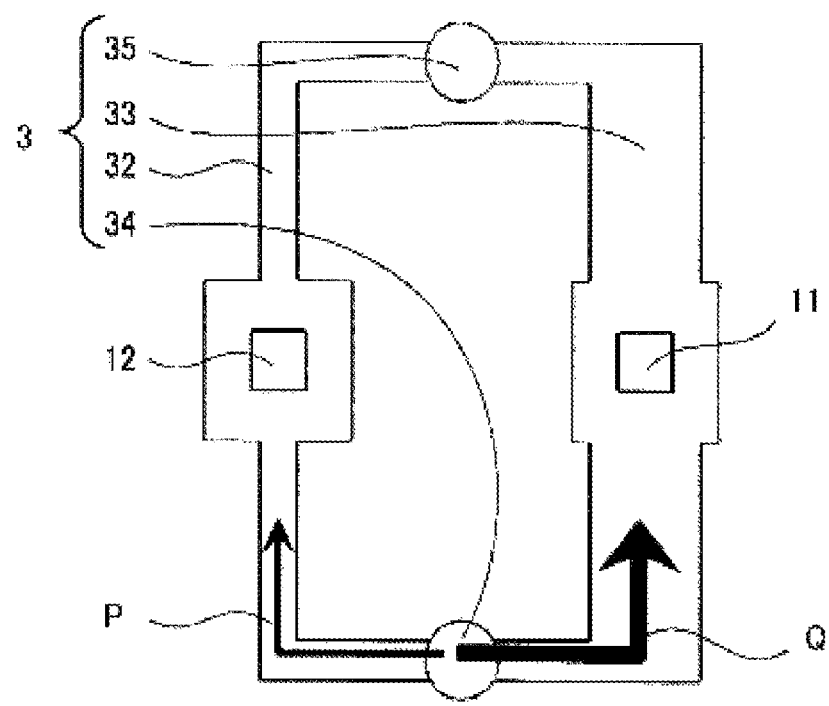
FIG. 3 is a plan view illustrating a secondary flow path portion.

FIG. 3 is a plan view illustrating the sub flow path portion 3 illustrated in FIG. 1. As illustrated in FIG. 3, one end of the substantially U-shaped physical property detection flow path 32 communicates with the inflow flow path 34, and the other end communicates with the outflow flow path 35. Similarly, one end of the substantially U-shaped flow rate detection flow path 33 communicates with the inflow flow path 34, and the other end communicates with the outflow flow path 35.

Both ends of the physical property detection flow path 32 and the flow rate detection flow path 33 also communicate with each other, and the physical property detection flow path 32 and the flow rate detection flow path 33 form a rectangular flow path on the upper surface of the sub flow path portion 3.

In the flow rate measurement device 1, a portion of the physical property detection flow path 32 including the physical property detector 12 and a portion of the flow rate detection flow path 33 including the flow rate detector 11 each have a square shape when viewed from a direction perpendicular to the upper surface of the sub flow path portion 3 (normal direction), and are formed at positions symmetrical with respect to a straight line connecting the inflow flow path 34 and the outflow flow path 35.

Arrows P and Q indicate the flow rates of the fluid to be measured which are divided into the physical property detection flow path 32 and the flow rate detection flow path 33. In the present embodiment, the widths of the physical property detection flow path 32 and the flow rate detection flow path 33 are set such that the fluid to be measured of the flow rate P flows into the physical property detection flow path 32 and the fluid to be measured of the flow rate Q flows into the flow rate detection flow path 33.

Although the values of the flow rate P and the flow rate Q vary depending on the flow rate of the fluid to be measured flowing through the main flow path portion 2, each of the width of the physical property detection flow path 32 and the flow rate detection flow path 33 is set such that the flow rate P becomes a value within the detection range of the physical property detector 12 and the flow rate Q becomes a value within the detection range of the flow rate detector 11 in a normal use mode. The widths of the physical property detection flow path 32 and the flow rate detection flow path 33 are merely examples, and are not limited to the example illustrated in FIG. 3.

As described above, in the flow rate measurement device 1, the flow rates of the fluid to be measured divided into the physical property detection flow path 32 and the flow rate detection flow path 33 can be individually controlled by adjusting the respective widths. Therefore, the flow rate of the fluid to be measured flowing through the physical property detection flow path 32 can be controlled according to the detection range of the physical property detector 12, and the flow rate of the fluid to be measured flowing through the flow rate detection flow path 33 can be controlled according to the detection range of the flow rate detector 11.

Therefore, since the physical property detector 12 can detect the physical property of the fluid to be measured at the optimum flow rate corresponding to the specific detection range, the detection accuracy of the physical property detector 12 can be improved.

Similarly, since the flow rate detector 11 can detect the flow rate of the fluid to be measured at the optimum flow rate corresponding to the specific detection range, the detection accuracy of the flow rate detector 11 can be improved.

Each of the physical property detection flow path 32 and the flow rate detection flow path 33 is not limited to a configuration formed in a substantially U-shape. That is, the physical property detection flow path 32 and the flow rate detection flow path 33 may adopt other shapes as long as the widths are set such that the flow rate of the fluid to be measured passing through the physical property detection flow path 32 and the flow rate detection flow path 33 can be controlled.

Further, in the present embodiment, the shape of the portion including the physical property detector 12 in the physical property detection flow path 32 and the shape of the portion including the flow path detector 11 in the flow rate detection flow path 33 are square, but the present invention is not limited thereto. The shapes of the physical property detection flow path 32 and the flow rate detection flow path 33 may be determined according to the shapes of the physical property detector 12 and the flow rate detector 11 to be arranged, as long as the physical property detector 12 or the flow rate detector 11 can be arranged.

Therefore, for example, when the size of the physical property detector 12 is smaller than the width of the physical property detection flow path 32, the width of the portion including the physical property detector 12 in the physical property detection flow path 32 may be made equal to the width of the physical property detector 12. In this case, the portion extending in the longitudinal direction of the physical property detection flow path 32 is formed in a linear shape. The same applies to the flow rate detection flow path 33.

Figure 4:
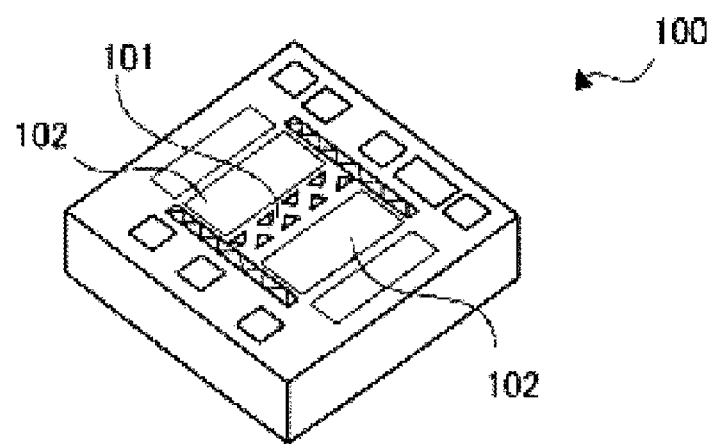
FIG. 4 is a perspective view illustrating an example of a sensor element.

FIG. 4 is a perspective view illustrating an example of a sensor element used in the flow rate detector and the physical property detector. FIG. 5 is a cross-sectional view for explaining a mechanism of the sensor element. A sensor element 100 includes a microheater (heating unit) 101 and thermopiles (temperature detectors) 102 provided symmetrically with respect to the microheater 101. Insulating thin films are formed on the upper and lower surfaces thereof, and are provided on the silicon substrate. The microheater 101 is a resistor formed of, for example, PolySi.

A cavity area 103, which is a recessed portion, is provided on the silicon substrate below the microheater 101 and the thermopile 102. The cavity area 103 is surrounded by a frame 104 made of PolySi. Since heat generated from the microheater 101 is released to the cavity area 103, diffusion of the heat into the silicon substrate is suppressed.

Further, since the frame 104 has a large heat capacity and is not easily heated, the temperature of the cold junction on the frame 104 does not appreciably rise, and the temperature difference from the hot junction can be detected more accurately.

FIG. 5 schematically illustrates a temperature distribution in the case where the microheater 101 generates heat by an ellipse of a broken line. The thicker the broken line is, the higher the temperature is. When there is no airflow, as illustrated in the upper part (1) of FIG. 5, the temperature distribution on both sides of the microheater 101 is substantially uniform. On the other hand, for example, when the air flows in the direction indicated by the broken line arrow in the lower part (2) of FIG. 5, the temperature is higher on the downward side than on the upward side of the microheater 101 because the surrounding air moves. The sensor element outputs a value indicating the flow rate by using such a deviation of the distribution of the heat generated by the heater.

An output voltage $\Delta V$ of the sensor element is represented by, for example, the following Math (1).

$$\Delta V = A \cdot (T_h - T_a)^b \sqrt{V_f} \tag{1}$$

Note that $T_h$ is the temperature of the microheater 101, $T_a$ is the temperature measured by an ambient temperature sensor provided outside the thermopile 102, $V_f$ is the average value of the flow velocity, and A and b are predetermined constants.

The circuit board 5 of the flow rate measurement device 1 includes a control unit (not illustrated) realized by an integrated circuit (IC) or the like, calculates a flow rate based on the output of the flow rate detector 11, detects dew condensation based on the output of the physical property detector 12, calculates a predetermined property value, and corrects the flow rate using the property value.

<Flow Rate Detector and Physical Property Detector>

Figure 7:
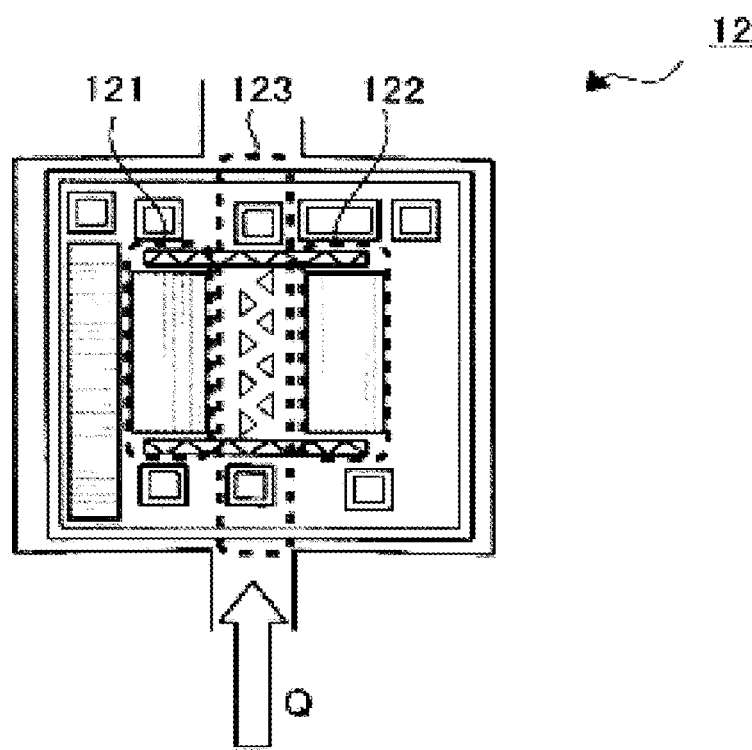
FIG. 7 is a plan view illustrating a schematic configuration of a physical property detector.

FIG. 6 is a plan view illustrating a schematic configuration of the flow rate detector 11 illustrated in FIG. 1. FIG. 7 is a plan view illustrating a schematic configuration of the physical property detector 12 illustrated in FIG. 1. In the flow rate measurement device 1, the physical property detection flow path 32 and the flow rate detection flow path 33 have different widths of flow paths extending in the longitudinal direction, and the width of the portion including the physical property detector 12 in the physical property detection flow path 32 is narrower than the width of the portion including the flow rate detector 11 in the flow rate detection flow path 33. Accordingly, in the flow rate measurement device 1, the flow rates of the fluids to be measured divided into the physical property detection flow path 32 and the flow rate detection flow path 33 are individually controlled.

As illustrated in FIG. 6, the flow rate detector 11 includes a first thermopile (a first temperature detector in the flow rate detector) 111 and a second thermopile (a second temperature detector in the flow rate detector) 112 that detect the temperature of the fluid to be measured, and a microheater 113 that heats the fluid to be measured. The microheater 113, the first temperature detector 111 in the flow rate detector, and the second temperature detector 112 in the flow rate detector are arranged side by side along the flow direction P of the fluid to be measured in the flow rate detector 11.

Further, the shapes of the microheater 113, the first temperature detector 111 in the flow rate detector, and the second temperature detector 112 in the flow rate detector are each substantially rectangular in a plan view, and the longitudinal directions thereof are orthogonal to the flow direction P of the fluid to be measured.

The first temperature detector 111 in the flow rate detector and the second temperature detector 112 in the flow rate detector are arranged such that the first temperature detector 111 in the flow rate detector is arranged on the upstream side of the microheater 113, and the second temperature detector 112 in the flow rate detector is arranged on the downstream side of the microheater 113. The first temperature detector 111 in the flow rate detector and the second temperature detector 112 in the flow rate detector detect temperatures at symmetrical positions across the microheater 113.

In the flow rate measurement device 1, sensors having substantially the same structure are used for the physical property detector 12 and the flow rate detector 11, and the sensors are arranged at different arrangement angles of 90 degrees with respect to the flow direction of the fluid to be measured. This allows the sensors having the same structure to function as the physical property detector 12 or the flow rate detector 11, thereby reducing the manufacturing cost of the flow rate measurement device 1.

On the other hand, as illustrated in FIG. 7, the physical property detector 12 includes a first thermopile (a first temperature detector in the physical property detector) 121 and a second thermopile (a second temperature detector in the physical property detector) 122 that detect the temperature of the fluid to be measured, and a microheater (a heating unit in the physical property detector) 123 that heats the fluid to be measured. The heating unit 123 in the physical property detector, the first temperature detector 121 in the physical property detector, and the second temperature detector 122 in the physical property detector are arranged side by side in a direction orthogonal to the flow direction Q of the fluid to be measured in the physical property detector 12.

Further, the shapes of the heating unit 123 in the physical property detector, the first temperature detector 121 in the physical property detector, and the second temperature detector 122 in the physical property detector are substantially rectangular in a plan view, and the longitudinal directions thereof are along the flow direction Q of the fluid to be measured.

Further, the first temperature detector 121 in the physical property detector, and the second temperature detector 122 in the physical property detector are disposed symmetrically with respect to the heating unit 123 in the physical property detector, and detect temperatures at symmetrical positions across the heating unit 123 in the physical property detector. Therefore, the first temperature detector 121 in the physical property detector, and the second temperature detector 122 in the physical property detector are substantially the same, and either one of the values may be adopted, or an average value of the two values may be calculated.

Here, since the temperature distribution is biased to the downstream side due to the flow of the fluid to be measured, the change in the temperature distribution in the direction orthogonal to the flow direction is smaller than the change in the temperature distribution in the flow direction of the fluid to be measured. Therefore, by arranging the first temperature detector 121 in the physical property detector, the heating unit 123 in the physical property detector, and the second temperature detector 122 in the physical property detector in this order in the direction orthogonal to the flow direction of the fluid to be measured, it is possible to reduce changes in the output characteristics of the first temperature detector 121 in the physical property detector, and the second temperature detector 122 in the physical property detector resulting from the change in temperature distribution.

Accordingly, the influence of the change in the temperature distribution due to the flow of the fluid to be measured can be reduced, and the detection accuracy of the physical property value detector 12 can be improved.

Further, since the longitudinal direction of the heating unit 123 in the physical property detector is arranged along the flow direction of the fluid to be measured, the heating unit 123 in the physical property detector can heat the fluid to be measured over a wide range in the flow direction of the fluid to be measured. Therefore, even when the temperature distribution is biased to the downstream side due to the flow of the fluid to be measured, it is possible to reduce changes in the output characteristics of the first temperature detector 121 in the physical property detector, and the second temperature detector 122 in the physical property detector.

Accordingly, the influence of the change in the temperature distribution due to the flow of the fluid to be measured can be reduced, the influence of the change in the temperature distribution due to the flow of the fluid to be measured can be reduced, and the detection accuracy of the physical property detector 12 can be improved.

Further, since the longitudinal directions of the first temperature detector 121 in the physical property detector, and the second temperature detector 122 in the physical property detector are arranged along the flow direction of the fluid to be measured, the first temperature detector 121 in the physical property detector, and the second temperature detector 122 in the physical property detector can detect the temperature in a wide range over the flow direction of the fluid to be measured. Therefore, even when the temperature distribution is biased to the downstream side due to the flow of the fluid to be measured, it is possible to reduce changes in the output characteristics of the first temperature detector 121 in the physical property detector, and the second temperature detector 122 in the physical property detector.

Accordingly, the influence of the change in the temperature distribution due to the flow of the fluid to be measured can be reduced, and the detection accuracy of the physical property value detector 12 can be improved.

<Functional Configuration>

Figure 8:
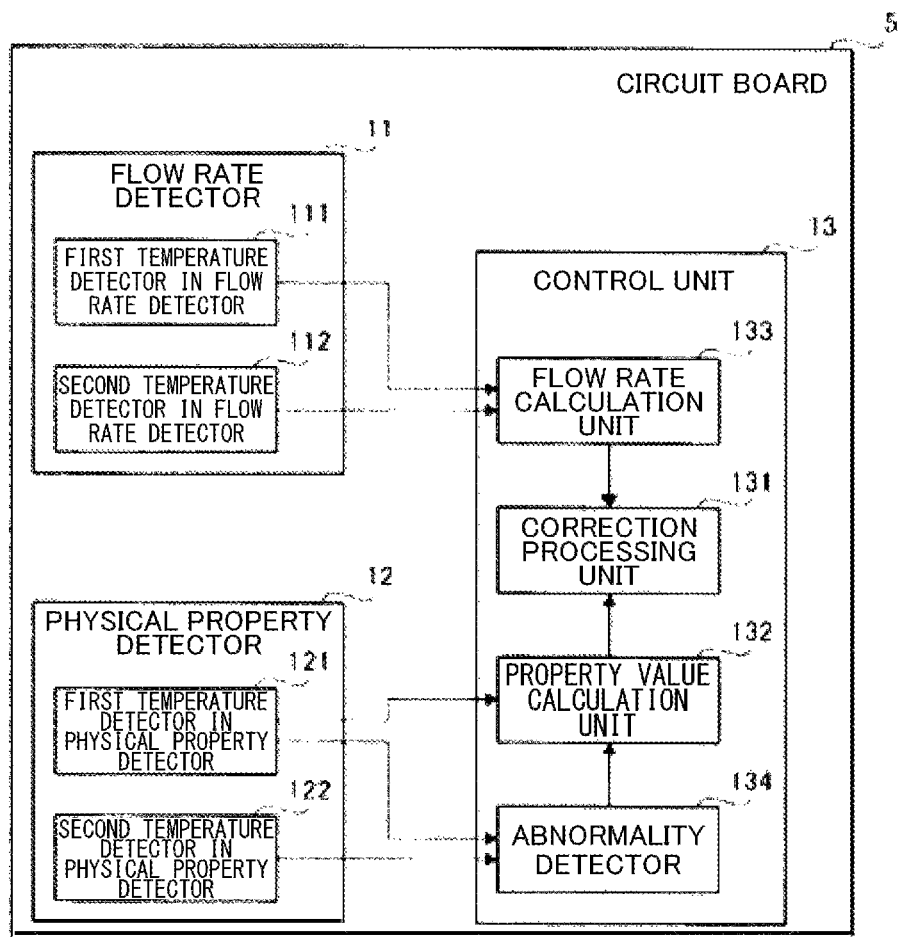
FIG. 8 is a block diagram illustrating a functional configuration of a circuit board.

FIG. 8 is a block diagram illustrating a functional configuration of the circuit board 5 included in the flow rate measurement device 1. The flow rate measurement device 1 includes the flow rate detector 11, the physical property detector 12, and the control unit 13.

The flow rate detector 11 includes the first temperature detector 111 in the flow rate detector and the second temperature detector 112 in the flow rate detector. The physical property detector 12 includes the first temperature detector 121 in the physical property detector, and the second temperature detector 122 in the physical property detector. The microheater 113 illustrated in FIG. 6 and the microheater (the heating unit in the physical property detector) 123 illustrated in FIG. 7 are not illustrated.

The flow rate detector 11 detects a value indicating the flow rate of the fluid to be measured based on the temperature detection signals output from the first temperature detector 111 in the flow rate detector and the second temperature detector 112 in the flow rate detector.

Specifically, the flow rate detector 11 calculates a difference between the temperature detection signal output from the first temperature detector 111 in the flow rate detector and the temperature detection signal output from the second temperature detector 112 in the flow rate detector, and obtains a value indicating the flow rate of the fluid to be measured based on the difference. Then, the flow rate detector 11 outputs the value indicating the flow rate to the control unit 13.

The physical property detector 12 outputs the temperature detection signals output from the first temperature detector 121 in the physical property detector and the second temperature detector 122 in the physical property detector to a flow rate calculation unit 133.

Specifically, the physical property detector 12 obtains an average value of the temperature detection signals output from the first temperature detector 121 in the physical property detector and the second temperature detector 122 in the physical property detector.

For example, the heating unit 123 in the physical property detector illustrated in FIG. 7 changes the temperature according to the control by the control unit 13. This enables the first temperature detector 121 in the physical property detector and the second temperature detector 122 in the physical property detector to obtain output values before and after the temperature change of the heating unit 123 in the physical property detector. The physical property detector 12 outputs the obtained output values to the control unit 13.

The control unit 13 includes a correction processing unit 131, a property value calculation unit 132, the flow rate calculation unit 133, and an abnormality detector 134. The flow rate calculation unit 133 calculates the flow rate of the fluid to be measured based on the detection value of the flow rate detector 11. The property value calculation unit 132 calculates a property value based on the detection value of the physical property detector 12.

Specifically, the property value calculation unit 132 changes the temperature of the microheater of the physical property detector 12, and multiplies the difference between the temperatures of the fluid to be measured detected by the thermopile 102 before and after the change by a predetermined coefficient to calculate the property value. The correction processing unit 131 uses the property value to correct the flow rate calculated by the flow rate calculation unit 133.

In order to detect the amount of heat, the flow rate measurement device 1 as described above includes four thermopiles, that is, the first temperature detector 111 in the flow rate detector and the second temperature detector 112 in the flow rate detector included in the flow rate detector 11 illustrated in FIG. 6, and the first temperature detector 121 in the physical property detector and the second temperature detector 122 in the physical property detector included in the physical property detector 12 illustrated in FIG. 7.

Hereinafter, a thermopile corresponding to the first temperature detector 111 in the flow rate detector included in the flow rate detector 11 will be described in detail as an example. However, the same description applies to the thermopiles corresponding to the second temperature detector 112 in the flow rate detector, the first temperature detector 121 in the physical property detector, and the second temperature detector 122 in the physical property detector.

Figure 9:
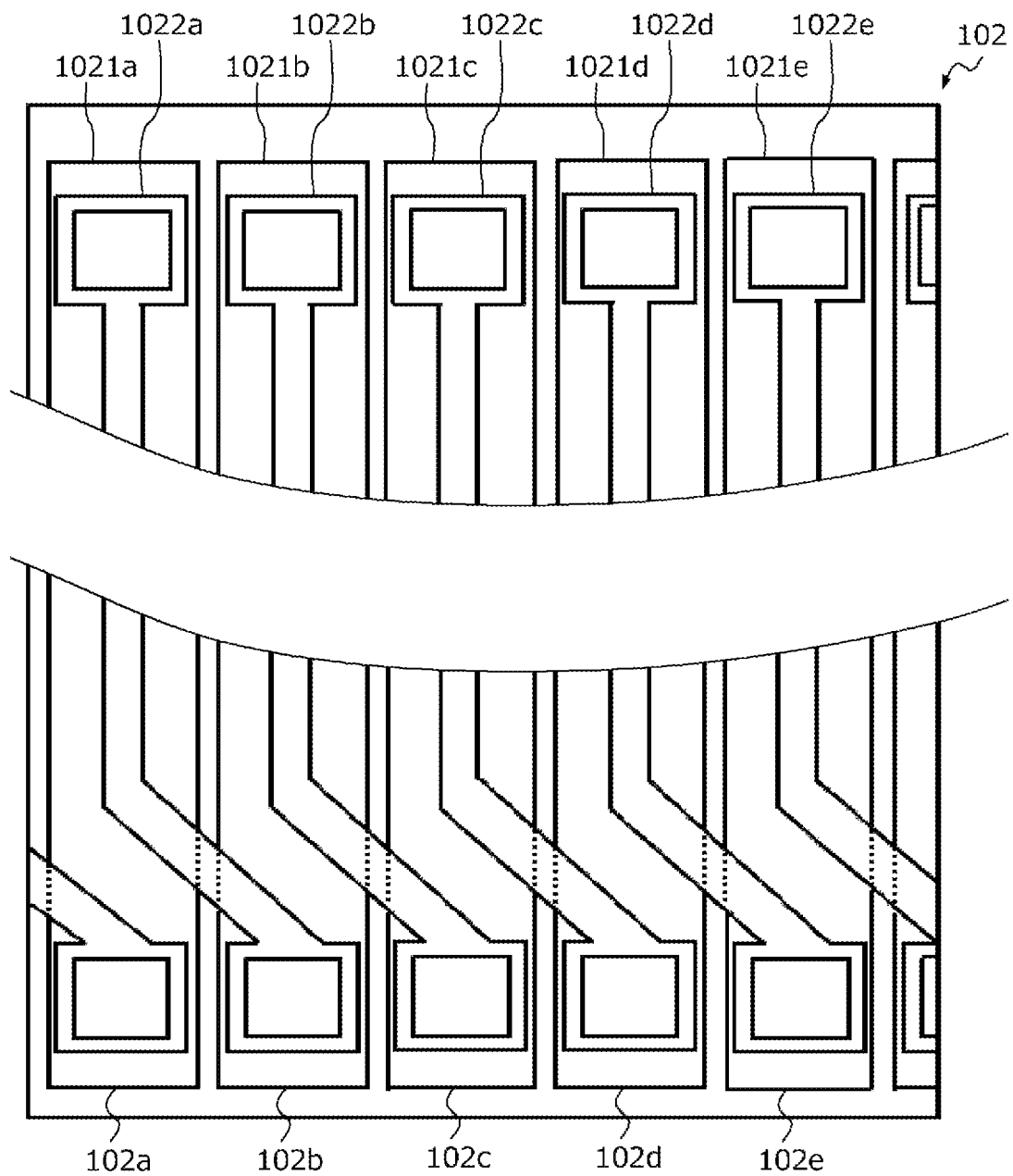
FIG. 9 is a schematic plan view illustrating a thermopile.

FIG. 9 is a schematic plan view illustrating the thermopile 102 corresponding to the first temperature detector 111 in the flow rate detector in the flow rate measurement device 1. The thermopile 102 in FIG. 9 is configured by connecting multiple thermocouples in series. In FIG. 9, thermocouples 102a to 102e are illustrated. The thermocouples include PolySi interconnects 1021a to 1021e and metal films 1022a to 1022e.

A positional relationship between the PolySi interconnects and the metal film in the thermocouples 102a to 102e is such that the metal film is on the upper side and the PolySi interconnect is on the lower side. That is, in each thermocouple, the metal film is formed on the PolySi interconnect. When a thermopile is formed by silicon and a metal film, the silicon film is a lower layer and the metal film is an upper layer in many cases. This is because, in a semiconductor process, elements are formed from the lower layer side (substrate side) and a silicon film element is formed first because of a heat resistance of silicon, contamination control, and the like. A width of the PolySi interconnect is set to be wider than a width of the metal film. Here, the metal films 1022a to 1022e correspond to a metallic interconnect in the present disclosure. Since the metal film has good thermal conductivity, heat escapes through the metal film when the width of the wiring is increased. In a thermopile that detects a temperature difference between a hot junction and a cold junction, the metal film is made as thin as possible in order to limit heat transfer by the metal film as much as possible.

Further, in order to connect the thermocouples in series from 102a to 102e, the metal film crosses gaps between the PolySi interconnects and is electrically connected to the adjacent PolySi interconnect. Next, a property of the metal film when the metal film is formed so as to cross the gap between the PolySi interconnects as illustrated in FIG. 9 will be described.

Figure 10:
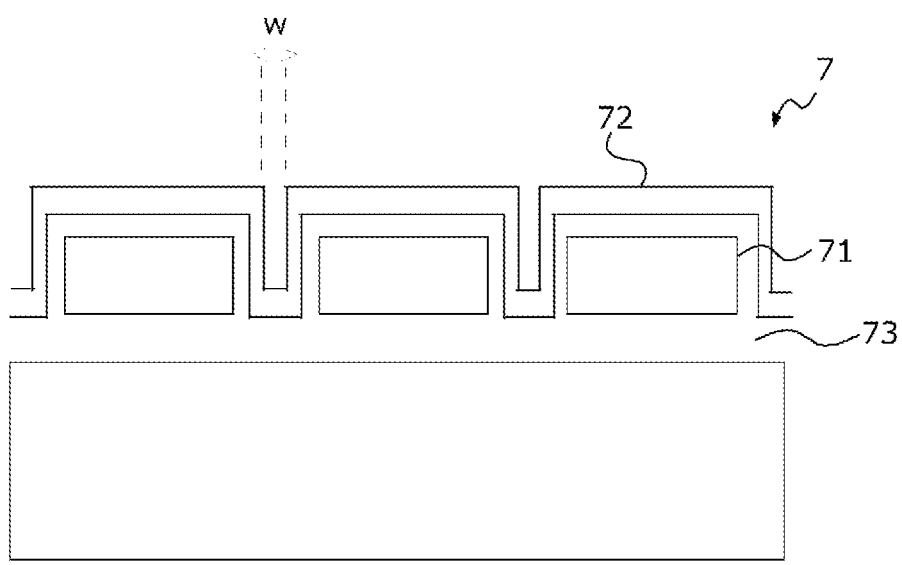
FIG. 10 is a schematic cross-sectional view illustrating a test pattern for verifying characteristics of a metal film formed so as to traverse a gap between PolySi interconnects.

FIG. 10 is a schematic cross-sectional view illustrating a test pattern 7 for verifying the property of the metal film formed so as to cross the gap between PolySi interconnects. A gap width w represents a width of the gap between test pattern silicones 71. Here, a test pattern metal interconnect 72 is arranged so as to cross the gap between the test pattern silicones 71. A test pattern insulating film 73 is used as a base. In FIG. 10, only two gaps are illustrated, but in an actual test pattern, several hundred to several thousand gaps are being crossed, and the test can be performed by accelerating the influence when the metal interconnect 72 crosses a gap having a step.

Table 1 illustrates the results of measuring a resistance value of the test pattern metal interconnect 72 by changing the gap width w in each of two patterns of 1.7 μm and 2.4 μm for the line width of the metal interconnect in the test pattern 7.

|  | w 0.5 um | w 1.0 um | w 2.0 um | [Ω] w 5.0 um |
|---|---|---|---|---|
| INTERCONNECT WIDTH 1.7 um | DISCONNECTED | 1636 | 1599 | 1565 |
| INTERCONNECT WIDTH 2.4 um | DISCONNECTED | 1133 | 1117 | 1082 |

As illustrated in Table 1, there is a tendency that the smaller the value of the gap width w is, the higher the resistance value is, and a result that disconnection occurs under the condition that the gap width w is 0.5 μm is obtained. It is considered that the reason why the resistance value of the test pattern metal interconnect 72 becomes high when the value of the gap width w is small is that it is difficult to form the metal film in the gap portion between the test pattern silicones 71 due to the small value of the gap width w, and the film thickness becomes thin. Further, it is considered that when the value of the gap width w is reduced to a certain degree or more, the metal film is broken, leading to disconnection. In a semiconductor process, a metal film is formed by a Physical Vapor Deposition (PVD) method or a Chemical Vapor Deposition (CVD) method. In these methods, metal atoms are sputtered in a vacuum atmosphere by a certain method, and the atoms reach the substrate, whereby a metal film grows. In general, a covering property of the film is poor at a stepped portion and the film thickness of the metal film tends to be thin, but it is considered that the covering property is more remarkably deteriorated due to the gap structure. That is, when the gap width w is small, the supply amount of metal atoms decreases, and the film thickness of the stepped portion becomes thin, resulting in the disconnection of the metal film.

In order to prevent such disconnection, it is conceivable to increase the wiring width. However, in the above measurement, increasing the wiring width is not so effective, and the influence of the value of the gap width w is greater. Further, increasing the wiring width promotes heat to escape through the metal interconnect, which may cause a decrease in sensor sensitivity. Otherwise, it is also conceivable to perform a planarization process such as Chemical Mechanical Polishing (CMP) before forming the metal film to fill the gap in advance. However, when the planarization process is introduced, since a film thickness of a membrane is made equal to the film thickness of the thickest portion of the element, the total thickness of the thin film is increased, the heat capacity of the membrane is increased, and the sensitivity of the thermopile sensor having the thin film is lowered.

Further, in order to increase the gap between the PolySi interconnect, a method of increasing the pitch between the interconnect may be considered. However, the number of thermocouples that can be arranged in the same area decreases, which leads to a decrease in the sensitivity of the thermopile sensor. Further, a method of thinning the wiring width of the PolySi interconnect may be considered, but when the PolySi interconnect having a higher resistance than the metal film is thinned, a parasitic resistance of the interconnect increases, causing noise generation and deterioration of the characteristics. Further, in a case of an infrared sensor, since the PolySi interconnect has good infrared absorption efficiency, when the interconnect becomes thin, the infrared absorption amount decreases, which leads to a decrease in sensitivity.

Based on the above result, in the present embodiment, the gap width of the portion where the metal film crosses, within the gap between the PolySi interconnects, is made greater than the gap width of the remaining portion. FIG. 11 is a schematic view illustrating a condition of the configuration of the thermopile 102 in a case where the gap width of the portion where the metal film crosses is made greater than the gap width of the remaining portion. In FIG. 11, "a" represents the width of the gap in a portion where the metal film 1022a crosses the gap between the PolySi interconnect 1021a and the adjacent PolySi interconnect, and "b" represents the width of the gap in a portion where the metal film does not cross the gap between the PolySi interconnect 1021a and the adjacent PolySi interconnect.

As a condition of the configuration, "a" is set to be wider than "b". For example, "a" may be 1.5 times or more of "b". Further, the value of "a" may be 1 μm or more, and the value of "b" may be 5 μm or less. Further, the value of "a" is equal to or greater than the film thickness of the PolySi interconnect.

FIG. 12 is a schematic diagram illustrating the details of the configuration of the thermopile 102. (a) of FIG. 12 is a plan view of a thermopile in which the gap width in the portion where the metal film crosses is wider than the gap width in the remaining portion, and (b) of FIG. 12 is a cross-sectional view taken along the line A-A'.

In FIG. 12, an insulating film 1023 as a base of the PolySi interconnect 1021a and the metal film 1022a is formed on the frame 104 of the silicon substrate 1024. The silicon substrate 1024 includes the cavity area 103, and a portion of the insulating film 1023 is located on the cavity area 103. Further, the metal film 1027 in a portion where the metal film crosses the gap between the PolySi interconnects is located on the frame 104 on the silicon substrate 1024.

The PolySi interconnect 1021a extends from the frame 104 to the vicinity of the center of the cavity area 103, and is short-circuited with the metal film 1022a in the vicinity of the center of the cavity area 103 (in the vicinity of the microheater 101) to form a hot junction 1025. The metal film 1022a extends from the vicinity of the center of the cavity area 103 toward the outer periphery on the PolySi interconnect 1021a via the insulating film 1023, crosses the gap with the adjacent PolySi interconnect in the upper portion of the frame 104, and is short-circuited with the adjacent PolySi to form a cold junction 1026. Thereafter, this structure is repeated.

<Embodiment 2>

Figure 13:
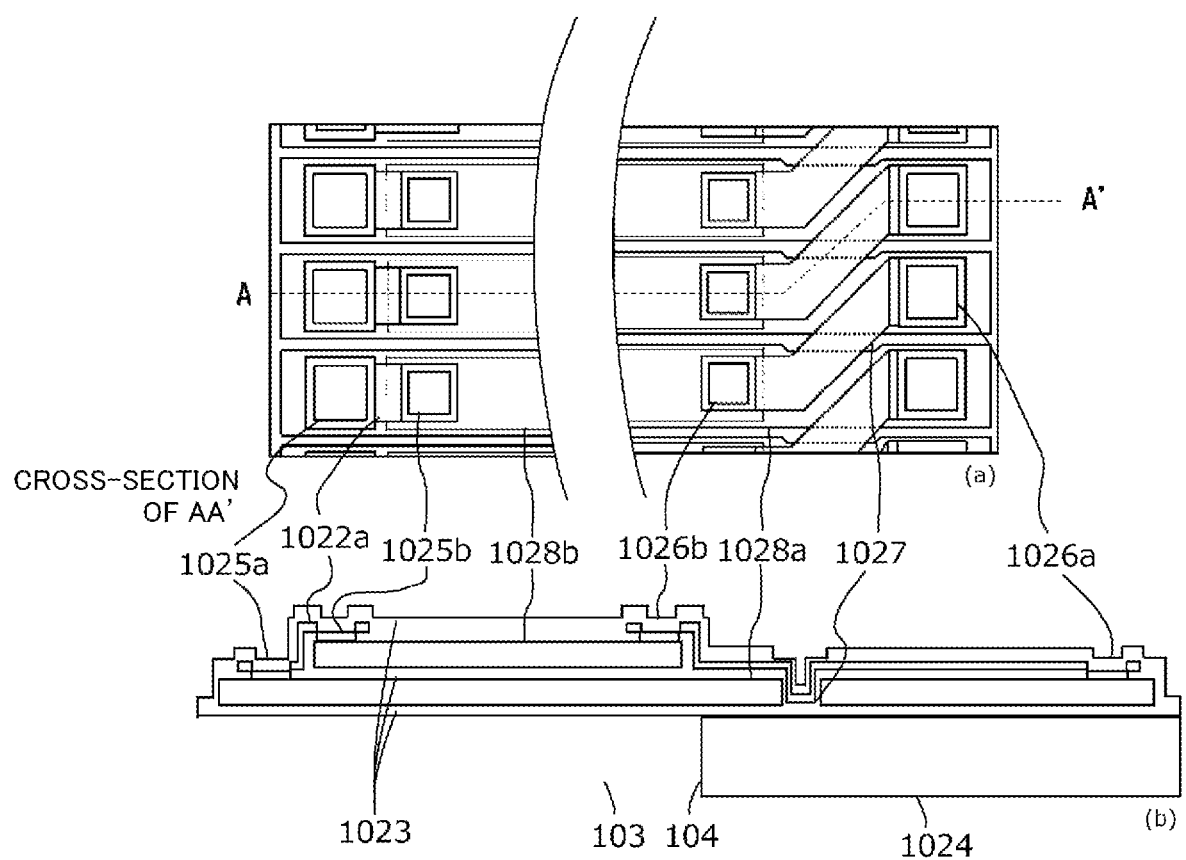
FIG. 13 is a schematic diagram illustrating a thermopile in which two layers of PolySi interconnects are applied to each pair and a hot junction and a cold junction are formed for each layer of PolySi interconnect.

Next, a second embodiment of the present disclosure will be described. The difference between this embodiment and the first embodiment is that two layers of PolySi interconnects are applied to each pair of thermopiles. FIG. 13 is a schematic diagram illustrating a thermopile in which two layers of PolySi interconnects are applied to each pair of the thermopiles 102 in the above-described embodiment, and a hot junction and a cold junction are formed for each layer of the PolySi interconnect. (a) of FIG. 13 is a plan view of the thermopile, and (b) of FIG. 13 is a cross-sectional view taken along the line A-A'.

In the present embodiment, as the PolySi interconnect, two layers of PolySi interconnects of a lower-layer PolySi interconnect 1028a and an upper-layer PolySi interconnect 1028b are formed. A hot junction located on the lower-layer PolySi interconnect 1028a is referred to as a lower-layer hot junction 1025a, and a hot junction located on the upper-layer PolySi interconnect 1028b is referred to as an upper-layer hot junction 1025b. Further, a cold junction located on the lower-layer PolySi interconnect 1028a is referred to as a lower-layer cold junction 1026a, and a cold junction located on the upper-layer PolySi interconnect 1028b is referred to as an upper-layer cold junction 1026b.

The lower-layer PolySi interconnect 1028a extends from the frame 104 to the vicinity of the center of the cavity area 103 and is short-circuited with the metal film 1022a in the vicinity of the center of the cavity area 103 to form the lower-layer hot junction 1025a. The metal film 1022a electrically connects the lower-layer hot junction 1025a and the upper-layer hot junction 1025b. Further, the metal films 1022a are connected at the shortest distances.

The upper-layer PolySi interconnect 1025b extends from the upper-layer cold junction 1026b provided in the vicinity of the center of the cavity area 103 to the upper-layer cold junction 1026b on the frame 104. Here, the upper-layer hot junction 1025b and the upper-layer cold junction 1026b are not connected by the metal film 1022a. The metal film 1022a moves to the adjacent lower-layer PolySi at a portion extending from the upper-layer cold junction 1026b to the lower-layer PolySi interconnect 1028a via the insulating film 1023. The metal film 1022a is short-circuited with the adjacent lower-layer PolySi to form the lower-layer cold junction 1026a. Thereafter, this structure is repeated. Here, the upper-layer PolySi interconnect 1028b corresponds to a second PolySi interconnect in the present disclosure.

The two layers of the PolySi interconnects contain different impurities, one being a p-type impurity and the other being an n-type impurity. PolySi varies in physical properties such as a resistance value, thermoelectric characteristics, and thermal conductivity depending on the type and concentration of impurities contained therein. In this modification, a greater electromotive force can be obtained by replacing a metal film having a low thermoelectromotive force with a PolySi having a high thermoelectromotive force and a polarity opposite to that of PolySi of the first layer.

<Embodiment 3>

Figure 14:
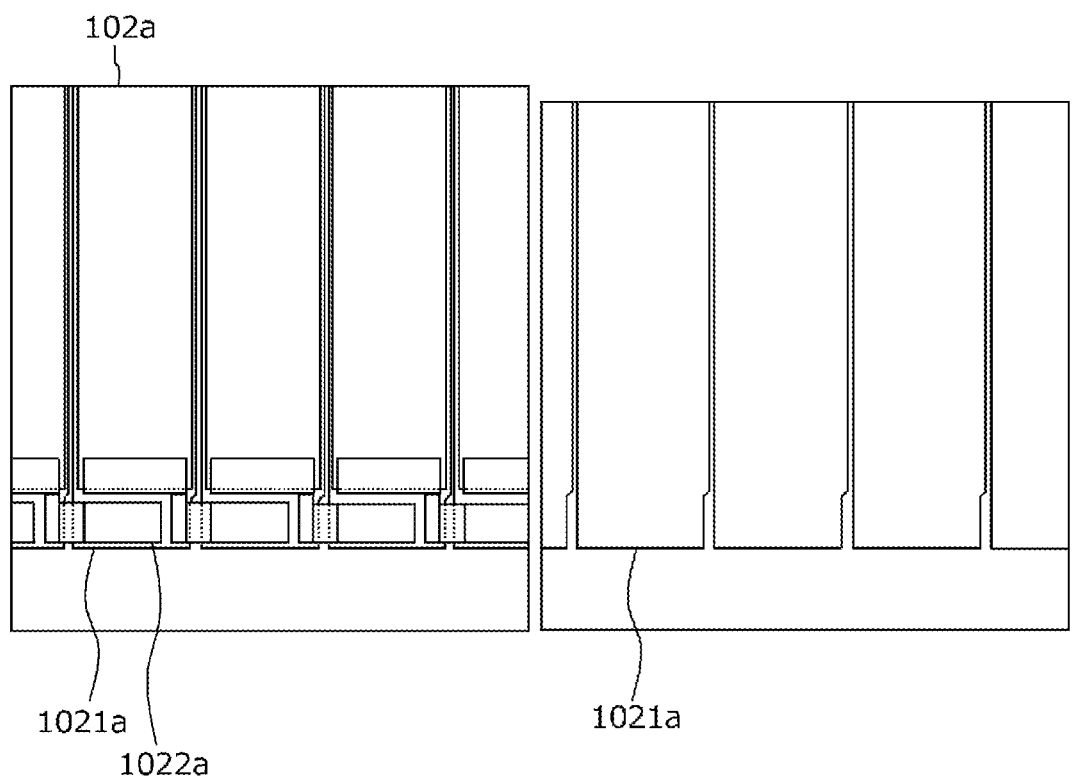
FIG. 14 is a schematic diagram illustrating a thermopile having a configuration in which a portion where a metal film crosses a gap between PolySi interconnects is located at an end portion of the PolySi interconnect.

Next, a third embodiment of the present disclosure will be described. The difference between this embodiment and the first embodiment is that the portion where the metal film crosses the gap between the PolySi interconnects is located at the end portion of the PolySi interconnect. FIG. 14 is a schematic diagram illustrating a thermopile having a configuration in which a portion where the metal film crosses the gap between the PolySi interconnects is located at the end portion of the PolySi interconnect in the thermopile 102 described above as an example in which the shape of the thermopile is modified.

The metal film 1022a overlaps only the end portion of the PolySi interconnect 1021a, crosses perpendicularly the gap between the PolySi interconnects, and is connected at the end portion of the adjacent PolySi interconnect. The metal film 1022a connects the end portions of the PolySi interconnect 1021a and the adjacent PolySi interconnect at the shortest distances, and does not overlap in parallel with the PolySi interconnect 1021a. With this configuration, the metal films are connected linearly and continuously. By simplifying the configuration, a reliability can be improved.

In the above-described embodiments, the thermopile sensor according to the present disclosure is applied to the flow rate measuring apparatus, but the thermopile sensor according to the present disclosure can be applied to general sensors having a function of detecting a temperature by a thermopile, such as an infrared sensor.

In the following description, the components of the present disclosure are denoted by reference numerals in the drawings in order to make it possible to compare the components of the present disclosure with the configurations of the embodiments.

<Clause 1>

A thermopile sensor 1 includes: a thermopile 102. The thermopile is formed by connecting thermocouples 102a to 102b, in series on an insulating film 1023, in which a PolySi interconnect 1021a to 1021e and a metal interconnect 1022a to 1022e including a metal portion in at least a part thereof are connected, each of the thermocouples connected in series is arranged side by side with a predetermined gap, the metal interconnect is arranged to overlap the PolySi interconnect in each of the thermocouples, at a connection portion between a thermocouple and an adjacent thermocouple, the metal interconnect crosses the gap between the PolySi interconnects, and a width of a portion of the gap where the metal interconnect crosses the gap between the PolySi interconnects is greater than a width of a remaining portion of the gap between the PolySi interconnects.

DESCRIPTION OF SYMBOLS 1 flow rate measurement device
100 sensor element
101 microheater
102 thermopile
102a to 102e thermocouple
103 cavity area
104 frame
11 flow rate detector
12 physical property detector
13 control unit
2 main flow path portion
3 sub flow flow path portion
4 seal
5 circuit board
6 cover
7 test pattern
71 silicone for test pattern
72 test pattern metal interconnect
73 test pattern insulating film 1021a to 1021e PolySi interconnect
1022a to 1022e metal film
1023 insulating film
1024 silicon substrate
1025 hot junction
1025a lower-layer hot junction
1025b upper-layer hot junction
1026 cold junction
1026a lower-layer cold junction
1026b upper-layer cold junction
1027 metal film in a portion crossing a gap between PolySi interconnects
1028a lower-layer PolySi interconnect
1028b upper-layer PolySi interconnect

What is claimed is:

1. A thermopile sensor comprising: a thermopile; wherein the thermopile is formed by connecting thermocouples, in series on an insulating film, in which a first PolySi interconnect and a metal interconnect including a metal portion in at least a part thereof are connected, the thermocouples connected in series are arranged side by side with a predetermined gap, the metal interconnect is arranged to overlap the first PolySi interconnect in each of the thermocouples, at a connection portion between a thermocouple and an adjacent thermocouple, the metal interconnect crosses the gap between first PolySi interconnects, and a first width of a portion of the gap where the metal interconnect crosses the gap between the first PolySi interconnects is greater than a second width of a remaining portion of the gap between the first PolySi interconnects.

2. The thermopile sensor according to claim 1, wherein the insulating film is formed on a silicon substrate, the silicon substrate includes a cavity area that is a recessed portion opened to the insulating film side and a frame disposed so as to surround the cavity area, and
wherein the portion where the metal interconnect crosses the gap between the first PolySi interconnects is disposed over the frame.

3. The thermopile sensor according to claim 2, wherein the first PolySi interconnect extends from the frame toward a vicinity of a center of the cavity area, and the first PolySi interconnect is short-circuited with the metal interconnect in the vicinity of the center of the cavity area to form a hot junction, and
wherein the metal interconnect extends, on the first PolySi interconnect, from the vicinity of the center of the cavity area toward the frame, and the metal interconnect crosses the gap between the first PolySi interconnects and is electrically short-circuited with an end portion of an adjacent first PolySi interconnect to form a cold junction.

4. The thermopile sensor according to claim 1, wherein the first width of the portion of the gap where the metal interconnect crosses the gap between the first PolySi interconnects is 1.5 times to 5 times the second width of the remaining portion of the gap between the first PolySi interconnects.

5. The thermopile sensor according to claim 1, wherein the first width of the portion of the gap where the metal interconnect crosses the gap between the first PolySi interconnects is equal to or greater than a film thickness of the first PolySi interconnect.

6. The thermopile sensor according to claim 1, wherein the first width of the portion of the gap where the metal interconnect crosses the gap between the first PolySi interconnects is 1 μm to 10 μm.

7. The thermopile sensor according to claim 1, wherein the second width of the remaining portion of the gap between the first PolySi interconnects is 0.1 µm to 5 µm.

8. The thermopile sensor according to claim 1, wherein a part of the metal interconnect is formed by a second PolySi interconnect containing a second impurity different from a first impurity of the first PolySi interconnect.

9. The thermopile sensor according to claim 8, wherein a center portion of the metal interconnect is formed by the second PolySi interconnect containing the second impurity different from the first impurity of the first PolySi interconnect, and both end portions of the metal interconnect are formed by a metal film.

10. The thermopile sensor according to claim 8, wherein the first impurity is a p-type impurity and the second impurity is an n-type impurity, or the second impurity is the p-type impurity and the first impurity is the n-type impurity.

\* \* \* \* \*